(12) United States Patent
Jiang et al.

(10) Patent No.: US 10,964,522 B2
(45) Date of Patent: Mar. 30, 2021

(54) HIGH RESOLUTION ELECTRON ENERGY ANALYZER

(71) Applicant: KLA-Tencor Corporation, Milpitas, CA (US)

(72) Inventors: Xinrong Jiang, Palo Alto, CA (US); Christopher Sears, Fremont, CA (US); Nikolai Chubun, Palo Alto, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 16/298,755

(22) Filed: Mar. 11, 2019

(65) Prior Publication Data

US 2019/0378705 A1 Dec. 12, 2019

Related U.S. Application Data

(60) Provisional application No. 62/681,476, filed on Jun. 6, 2018.

(51) Int. Cl.
*H01J 37/05* (2006.01)
*H01J 49/48* (2006.01)

(52) U.S. Cl.
CPC ............ *H01J 49/48* (2013.01); *H01J 37/05* (2013.01)

(58) Field of Classification Search
CPC .. H01J 37/05; H01J 2237/057; H01J 2237/14; H01J 2237/04922; H01J 2237/24485; H01J 49/48
See application file for complete search history.

(56) References Cited

U.S. PATENT DOCUMENTS

| | | | |
|---|---|---|---|
| 4,812,651 A * | 3/1989 | Feuerbaum | H01J 37/14 250/305 |
| 5,097,126 A | 3/1992 | Krivanek | |
| 5,166,518 A * | 11/1992 | Freedman | H01J 49/32 250/296 |
| 5,396,077 A | 3/1995 | Sohda et al. | |

(Continued)

FOREIGN PATENT DOCUMENTS

| | | |
|---|---|---|
| JP | 3665032 B2 | 6/2005 |
| JP | 4900389 B2 | 3/2012 |

OTHER PUBLICATIONS

Aleksandrov, A. V. et al., "Very-high-resolutiion energy analyser for electron beams", IOPscience, Abstract, http://iopscience.iop.org/article/10.1088/0957-0233/4/7/008, Printed Jun. 27, 2018, 2 pages.

(Continued)

*Primary Examiner* — Wyatt A Stoffa
(74) *Attorney, Agent, or Firm* — Suiter Swantz pc llo

(57) ABSTRACT

A high-resolution electron energy analyzer is disclosed. In one embodiment, the electron energy analyzer includes an electrostatic lens configured to generate an energy-analyzing field region, decelerate electrons of an electron beam generated by an electron source, and direct the decelerated electrons of the electron beam to the energy-analyzing field region. In another embodiment, the electron energy analyzer includes an electron detector configured to receive one or more electrons passed through the energy-analyzing field region. In another embodiment, the electron detector is further configured to generate one or more signals based on the one or more received electrons.

26 Claims, 14 Drawing Sheets

(56) References Cited

U.S. PATENT DOCUMENTS

| | | | | |
|---|---|---|---|---|
| 5,464,978 | A * | 11/1995 | Kudo | H01J 49/02 250/305 |
| 6,495,826 | B2 | 12/2002 | Tsuno | |
| 6,664,546 | B1 | 12/2003 | McCord et al. | |
| 7,141,791 | B2 * | 11/2006 | Masnaghetti | H01J 37/05 250/311 |
| 7,276,694 | B1 * | 10/2007 | Bertsche | H01J 37/244 250/305 |
| 9,000,395 | B2 * | 4/2015 | Ren | H01J 37/12 250/396 R |
| 9,117,626 | B1 * | 8/2015 | Ren | H01J 37/05 |
| 9,384,936 | B2 * | 7/2016 | Ren | H01J 37/28 |
| 9,443,696 | B2 * | 9/2016 | Jiang | H01J 37/06 |
| 9,997,326 | B2 | 6/2018 | Dohi et al. | |
| 2004/0188607 | A1 | 9/2004 | Ose et al. | |
| 2004/0188613 | A1 * | 9/2004 | Kaji | H01J 37/05 250/311 |
| 2013/0256530 | A1 | 10/2013 | Jiang et al. | |
| 2014/0077077 | A1 | 3/2014 | Jiang et al. | |
| 2016/0322190 | A1 | 11/2016 | Jiang | |
| 2016/0365221 | A1 * | 12/2016 | Preikszas | H01J 37/10 |
| 2018/0082829 | A1 * | 3/2018 | Muro | H01J 37/244 |
| 2019/0355551 | A1 * | 11/2019 | Pavia | H01J 37/243 |

OTHER PUBLICATIONS

Andersen, W. H. J. et al., "A double wienfilter as a high resolution, high transmission electron energy analyser", IOPscience, Abstract, http://iopscience.iop.org/article/10.1088/0022-3735/3/2/309, Printed Jun. 26, 2018, 2 pages.

Lindau, I. et al., "High resolution electron energy analyser at ultrahigh vacuum conditions", IOPscience, Abstract, http://iopscience.iop.org/article/10.1088/0022-3735/4/12/002, Printed Mar. 13, 2019, 2 pages.

Martensson, N. et al., "A very high resolution electron spectrometer", Journal of Electron Spectroscopy and Related Phenomena, Abstract, vol. 70, Issue 2, Dec. 2, 1994, 2 pages.

Zhu, X. et al., "High resolution electron energy loss spectroscopy with two-dimensional energy and momentum mapping", Rev Sci Instrum, Aug. 2015; 86(8):083902, Abstract, https://www.ncbi.nlm.nih.gov/pubmed/26329206, 1 page.

International Search Report dated Sep. 26, 2019 for PCT/US2019/035436.

* cited by examiner

HIGH RESOLUTION ELECTRON ENERGY ANALYZER

CROSS-REFERENCE TO RELATED APPLICATION

The present application claims the benefit under 35 U.S.C. § 119(e) of U.S. Provisional Application Ser. No. 62/681,476, filed Jun. 6, 2018, entitled HIGH RESOLUTION ELECTRON ENERGY ANALYZER, naming Xinrong Jiang, Christopher Sears, and Nikolai Chubun as inventors, which is incorporated herein by reference in the entirety.

TECHNICAL FIELD

The present invention generally relates to electron sources, and, more particularly, to electron energy analyzers.

BACKGROUND

Energy spread of an electron beam is an important characteristic in the field of electron beam apparatuses, as chromatic aberration heavily influences both the on-axis focusing spot size, and the off-axis deflecting spot size. As such, the energy spread poses a bottleneck in improving the resolution of electron beam apparatuses. In particular, developing advanced electron sources with narrowed electron energy spreads (e.g., approximately 0.2 eV to approximately 0.3 eV) with cold field emission (CFE) and carbon nanotube (CNT) electron sources is of critical importance in improving the optical performance of currently available electron sources.

In order to characterize, define, and improve electron sources, it is first necessary to develop high-resolution electron energy analyzers. In order to precisely measure the electron source energy spread down to the order of 0.2~0.3 eV, the energy resolution of an electron analyzer should be on the order of 0.02~0.03 eV, or approximately ten percent of the electron source energy spread.

Currently available electron energy analyzers utilize sub-micron sized slits in order to achieve energy resolutions in the order of tens of milli-electron volts (meVs). However, manufacturing and optically aligning sub-micron slits is a very difficult and tedious process. Furthermore, in order to improve electron energy analyzers using slits, the size of the slits would have to be further reduced, thereby further complicating the manufacture and alignment of the electron energy analyzers.

Therefore, it would be desirable to provide a system and method that cure one or more of the shortfalls of the previous approaches identified above.

SUMMARY

A high-resolution electron energy analyzer is disclosed. In one embodiment, the electron energy analyzer includes an electrostatic lens configured to generate an energy-analyzing field region, decelerate electrons of an electron beam generated by an electron source, and direct the decelerated electrons of the electron beam to the energy-analyzing field region. In another embodiment, the electron energy analyzer includes an electron detector configured to receive one or more electrons passed through the energy-analyzing field region. In another embodiment, the electron detector is further configured to generate one or more signals based on the one or more received electrons.

A system is disclosed. In one embodiment, the system includes an electron source configured to generate an electron beam. In another embodiment, the system includes a magnetic lens configured to receive the electron beam. In another embodiment, the system includes an electrostatic lens configured to. The electrostatic lens may be configured to generate an energy-analyzing field region, decelerate electrons of the electron beam; and direct the decelerated electrons of the electron beam to the energy-analyzing field region. In another embodiment, the system includes an electron detector configured to receive one or more electrons passed through the energy-analyzing field region, wherein the electron detector is further configured to generate one or more signals based on the one or more received electrons.

A method of analyzing electron energies is disclosed. In one embodiment, the method includes: generating an energy-analyzing field region with a unipotential electrostatic lens; decelerating electrons of an electron beam generated by an electron source; directing the electrons of the electron beam to the energy-analyzing field region of the unipotential electrostatic lens; receiving electrons which passed through the energy-analyzing field region with an electron detector; and generating, with the electron detector, one or more signals based on the received electrons.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Reference will now be made in detail to the subject matter disclosed, which is illustrated in the accompanying drawings.

Referring generally to FIGS. 1-12, a system and method for a high-resolution electron energy analyzer is disclosed, in accordance with one or more embodiments of the present disclosure.

Energy spread of an electron beam is an important characteristic in the field of electron beam apparatuses. In order to characterize, define, and improve electron sources, it is first necessary to develop high-resolution electron energy analyzers which may measure energy spread of an electron beam with high accuracy and precision. Currently available electron energy analyzers utilize sub-micron sized slits in order to achieve energy resolutions in the order of tens of milli-electron volts (meVs). However, manufacturing and optically aligning sub-micron slits is a very difficult and tedious process. Furthermore, in order to improve electron energy analyzers using slits, the size of the slits would have to be further reduced, further complicating the manufacture and alignment of the electron energy analyzers. In this regard, embodiments of the present disclosure are directed at curing one or more of the shortfalls of previous approaches identified above.

Embodiments of the present disclosure are directed to a high-resolution electron energy analyzer. More particularly, embodiments of the present disclosure are directed to a slit-free electron energy analyzer with an energy resolution in the order of tens of milli-electron volts (meVs). Additional embodiments of the present disclosure are directed to an electron energy analyzer which utilizes an electrostatic lens (e.g., a unipotential electrostatic lens) in order to generate an energy-analyzing field region. It is contemplated herein that the system and method of the present disclosure may enable the manufacture of more accurate and precise electron energy analyzers, which will then, in turn, enable improvements of currently available electron sources.

Figure 1:
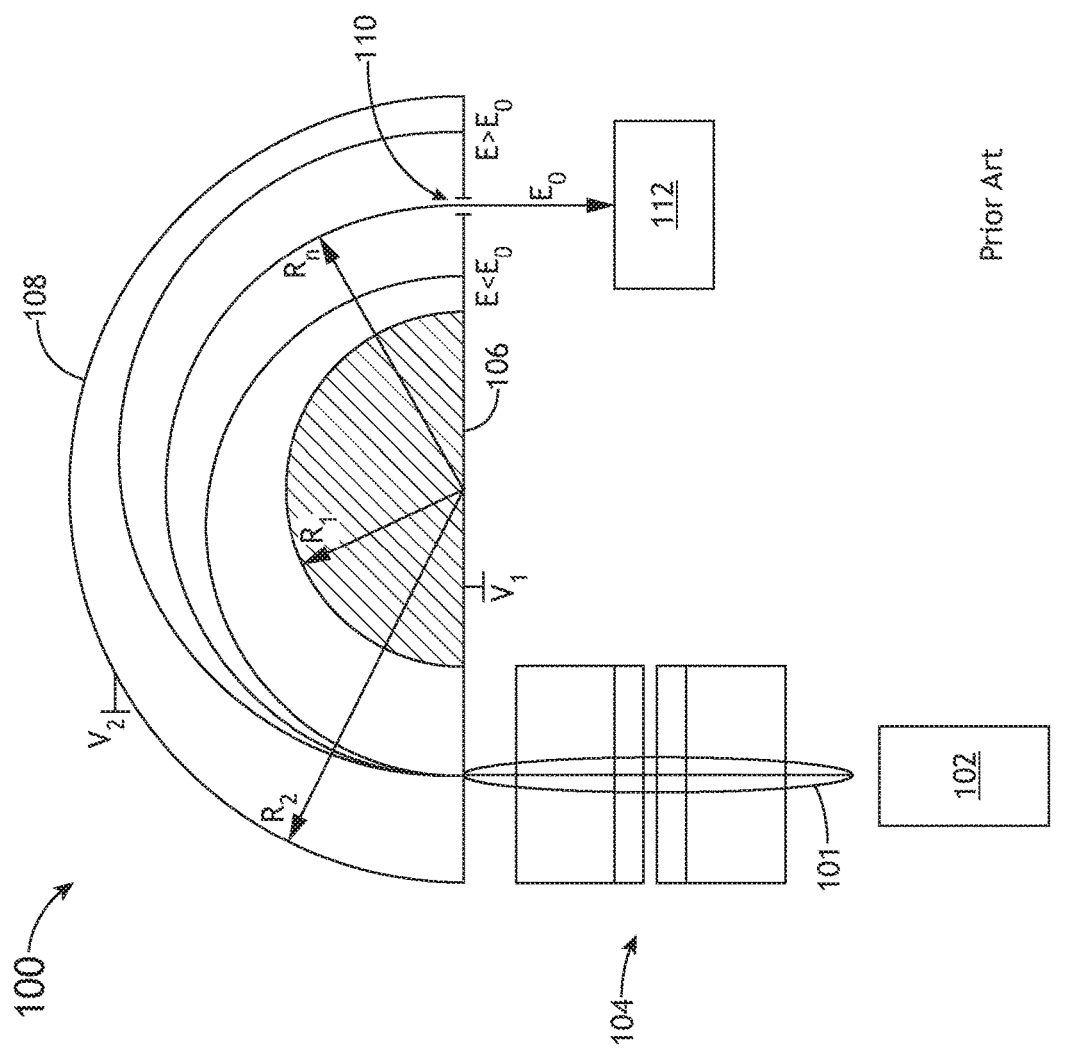
FIG. 1 illustrates a hemispherical electron energy analyzer.

FIG. 1 illustrates a hemispherical electron energy analyzer 100. The hemispherical electron energy analyzer 100 may represent a typical energy analyzer used in measuring the kinetic energy of photoelectrons produced in photoemissions. In this regard, the hemispherical electron energy analyzer 100 illustrated in FIG. 1 is provided as an example of a previous energy analyzer system, from which the advantages of the system and method of the present disclosure may be compared.

The hemispherical electron energy analyzer 100 may include an electron source 102 configured to generate an electron beam 101. A lens sub-system 104 is configured to direct the electron beam 101 to an inner hemisphere 106 defined by radius $R_1$ and an outer hemisphere 108 defined by radius $R_2$. The hemispherical electron energy analyzer 100 may be configured to disperse electrons within the hemispheres 106, 108 with applied voltages $V_1$ and $V_2$. Electrons with varying energy levels will respond to the applied voltages differently, thereby dispersing the electrons within the outer hemisphere 108 depending on the energy levels of the electrons. In this regard, the dispersion within the hemispherical electron energy analyzer 100 depends both on the applied voltages (e.g., $V_1$ and $V_2$) and the kinetic energies of the incident electrons.

Electrons with energy levels $E_0$ may follow a central trajectory along a curved/hemispherical electron path and may exit the outer hemisphere 106 through a slit 110 disposed at an exit plane of the outer hemisphere 108, where they may be detected by the electron detector 112. Conversely, electrons with higher and lower energy levels (e.g., $E>E_0$ and $E<E_0$) may be dispersed from the central trajectory by the applied voltages, such that the electrons are blocked at the exit plane of the outer hemisphere 106 and are not detected by the electron detector 112.

Figure 2:
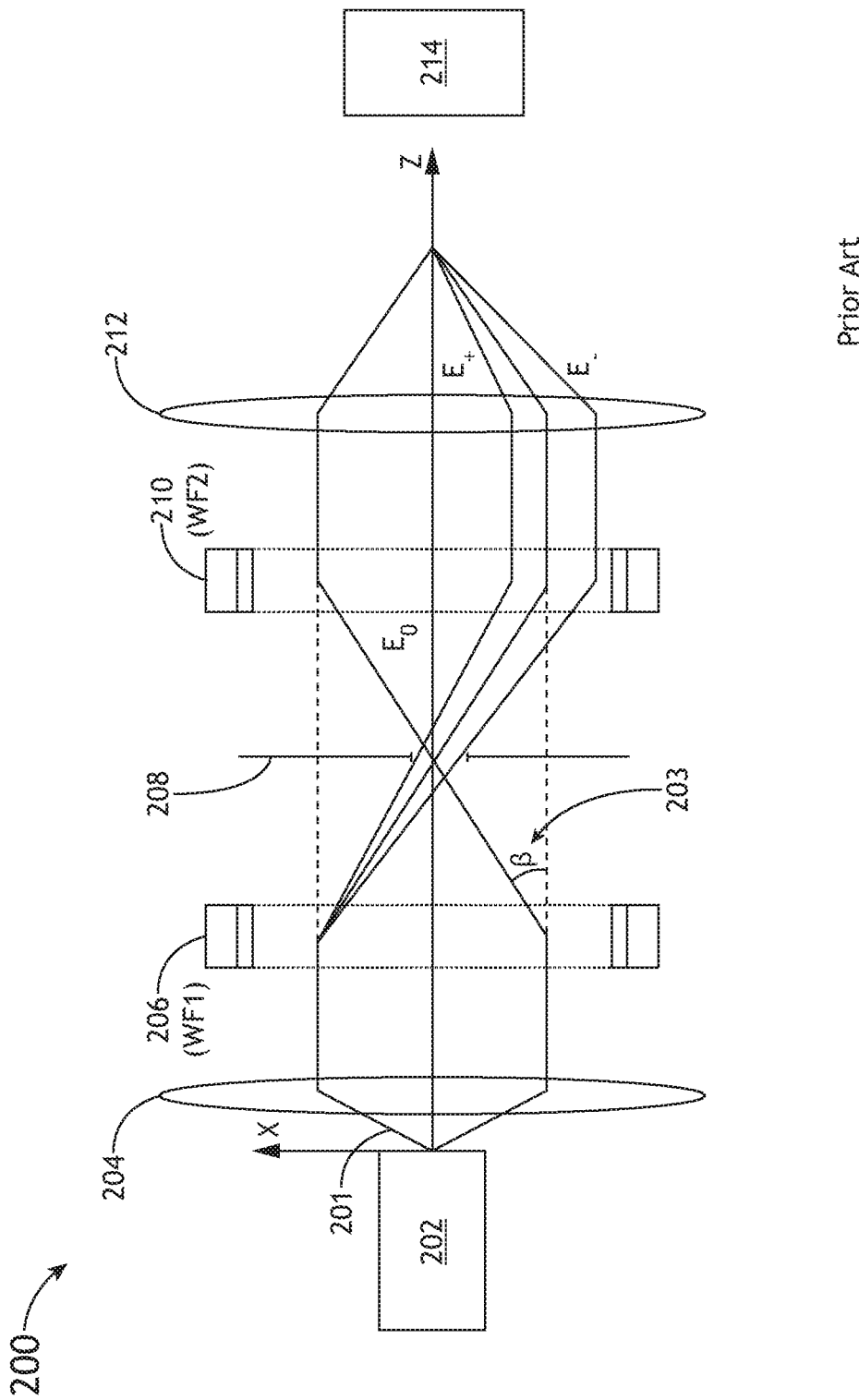
FIG. 2 illustrates a dual Wien-filter monochromator.

FIG. 2 illustrates a dual Wien-filter monochromator 200. Similarly, the dual Wien-filter monochromator 200 illustrated in FIG. 2 is provided as another example of a previous energy analyzer system, from which the advantages of the system and method of the present disclosure may be compared.

The dual Wien-filter monochromator 200 may include an electron source 202 configured to generate an electron beam 201, a gun lens 204, a first Wein filter 206, a slit-aperture 208, a second Wien filter 210, a condenser lens 212, and an electron detector 214. During operation, the gun lens 204 is configured to direct the electron beam 201 to the first Wien filter 206. The first Wien filter is then configured to focus the electron beam 201 and select electrons with narrowed energy spread. All electrons which are outside of the selected energy spread will then be blocked by the slit aperture 208, whereas electrons within the selected energy spread may pass through the slit aperture 208. In this regard, the first Wien filter 206 may act as an energy filter by reducing the energy spread of the electron source 202. The second Wien filter may then be configured to recover the electron beam 201 such that the beam profile in the x-z plane is equivalent to the beam profile in the y-z plane, without any defocus in the respective planes. Subsequently, the condenser lens 212 may be configured to direct the recovered electron beam to the electron detector 214, which is configured to detect electrons and measure the electron spread.

Generally speaking, currently available electron energy analyzers (e.g., hemispherical electron energy analyzer 100, dual Wien-filter monochromator 200, and the like) exhibit insufficient energy filtering resolution to accurately/precisely measure the energy spreads of advanced electron sources, such as cold field emission (CFE) and carbon nanotube (CNT) electron sources. For example, the energy spread of CFE and/or CNT electron sources may be approximately 0.2-0.3 eV. In order to accurately measure these energy spreads precisely, the energy resolution of an electron energy analyzer must be approximately 0.02-0.03 eV. In other words, any error generated by the electron energy analyzer must be 10% of the electron energy spread to be measured.

In order to achieve an electron energy analyzer resolution of 0.02-0.03 eV, the size of the slits (e.g., slit 110, slit aperture 208) of the hemispherical electron energy analyzer 100 and/or dual Wien-filter monochromator would have to be around 0.1 microns. However, precisely manufacturing slits on the order of 0.1 microns is extremely difficult. Furthermore, accurately aligning such small slits is highly impracticable, and exceedingly difficult to implement in an electron-optical system. In this regard, some embodiments of the present disclosure are directed to a system and method for a slit-free (or aperture-free) electron energy analyzer. By eliminating the need to precisely manufacture sub-micron slits/apertures, it is contemplated herein that the slit-free electron energy analyzer of the present disclosure may be configured to achieve an energy resolution in the order of tens of milli-electron volts.

Figure 3:
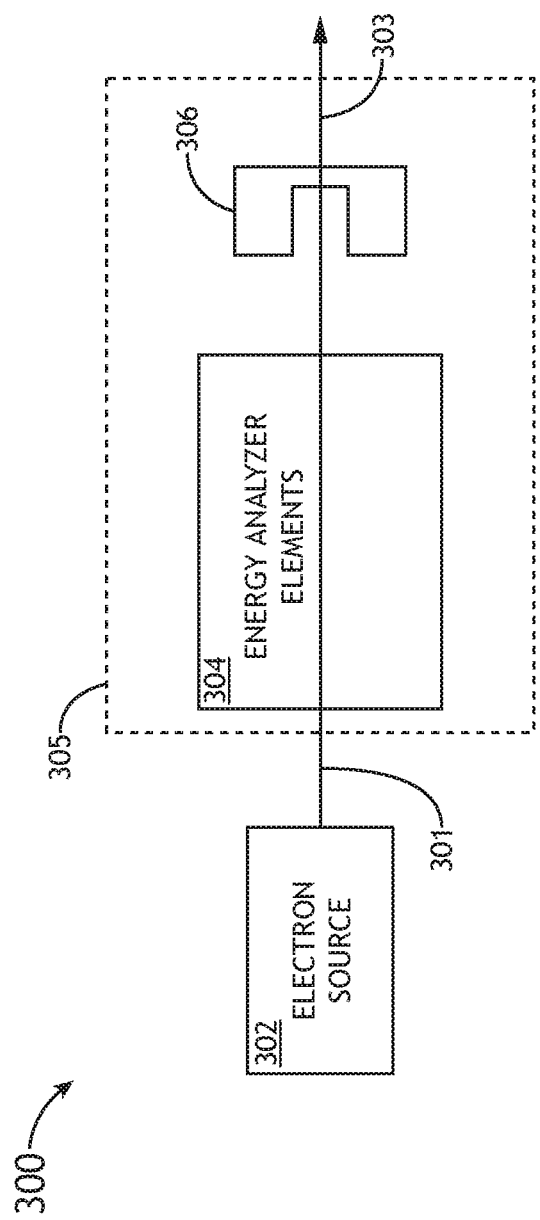
FIG. 3 illustrates a simplified block diagram of an electron-optical system, in accordance with one or more embodiments of the present disclosure.

FIG. 3 illustrates a simplified block diagram of an electron-optical system 300, in accordance with one or more embodiments of the present disclosure. The electron-optical system 300 may include, but is not limited to, an electron source 302 configured to generate an electron beam 101, and an energy analyzer 305. The energy analyzer 305 may include one or more energy-analyzer elements 304 and an electron detector 306.

In one embodiment, the electron source 302 is configured to generate an electron beam 301, and direct the electron beam 301 along an optical axis 303 (represented by the z-axis). In another embodiment, the one or more energy analyzer elements 304 are configured to disperse electrons of the electron beam 301 such that the electron detector 306 may detect the dispersed electrons, and thereby determine an electron energy spread of the electron source 302 and/or the electron beam 301.

FIG. 4A illustrates a graph 400 depicting the energy spread of an electron source 302, in accordance with one or more embodiments of the present disclosure.

In one embodiment, the graph 400 may illustrate the energy spread of the electron source 302 depicted in FIG. 3. Energy spread of an electron source 302 is depicted as $\Delta E_s$. It is noted herein that energy spread (e.g., electron source energy spread $\Delta E_s$) may be defined in a number of different manners, including, but not limited to, the 20-80% method, the full width half maximum (FWHM) method, and the like. However, for the purposes of the present disclosure, references to "energy spread" will be regarded as 20-80% energy spread measurements. For example, as shown in FIG. 4A, the electron source energy spread $\Delta E_s$ may be defined as the 20-80% current rise measurement, shown as the energy difference between electrons in the twentieth percentile and electrons in the eightieth percentile. In this regard, the electron source current-rise measurement may be defined as a function of electron energy, $N_s(E)$. It is further noted, however, that energy spreads may be defined in any manner known in the art without departing from the spirit and scope of the present disclosure.

FIG. 4B illustrates a graph 402 depicting the energy spread of an electron analyzer, in accordance with one or more embodiments of the present disclosure.

In one embodiment, graph 402 may illustrate the energy resolution of the one or more energy analyzer elements 304 of the energy analyzer 305. As noted previously herein, in order to be able to precisely measure electron source energy spread ($\Delta E_s$) with an energy analyzer 305, the energy analyzer 305 itself, including the energy analyzer elements 304, must itself have a sufficiently high energy resolution. The energy resolution of an energy analyzer 305 may be measured from a δ-response function, $N_a(E)$, as shown in FIG. 4B. The δ-response function is an electron current-rise measurement of the energy analyzer 305 (e.g., one or more energy analyzer elements 304) by an electron recorder/detector (e.g., electron detector 306) to a monochromatic electron source 302. A monochromatic electron source may be mathematically referred to as a δ-function, or $\delta(\Delta E)$ with $\Delta E \rightarrow 0$.

When using the energy analyzer 305 to measure a multichromatic electron source with an energy spread $\Delta E_s$, as shown in FIG. 3, the electron detector 306 may collect the total electron current-rise, $N_{tot}(E)$, as shown in FIG. 4C.

FIG. 4C illustrates a graph 404 depicting the total energy spread of an electron analyzer system 300, in accordance with one or more embodiments of the present disclosure.

In particular, FIG. 4C illustrates the total electron current-rise, $N_{tot}(E)$ collected by the electron detector 306. The total electron current-rise function $N_{s\ tot}(E)$ may be described as a convolution of the electron source energy function, $N_s(E)$, and the δ-response function, $N_a(E)$, such that $N_{tot}(E) = N_s(E) * N_a(E)$. According to the Convolution Theorem, the energy spread $\Delta E_{tot}$ in the total response function $N_{tot}(E)$ is greater than the larger in the convoluted functions (e.g., $\Delta E_{tot} > \Delta E_s$, and $\Delta E_{tot} > \Delta E_a$. This may be clearly seen by comparing FIG. 4C to FIGS. 4A and 4B, in that $\Delta E_{tot}$ is greater than either $\Delta E_s$ and/or $\Delta E_a$.

Accordingly, the energy resolution of the energy analyzer 305 should be sufficiently high in order to accurately/precisely measure the energy spread of the electron source 302. More specifically, as noted previously herein, the energy resolution of the electron analyzer 305 should be approximately ten percent of the electron source 302 energy spread (e.g., $\Delta E_s \leq 0.1 * \Delta E_s$). By way of example, for a CFE and/or CNT electron source with an energy spread of $\Delta E_s \approx 0.2$-0.3 eV, the resolution of the energy analyzer 305 must be $\Delta E_s \approx 0.02$-0.03 eV.

It is noted herein that electrons within an electron beam 301 generated by an electron source 302 are commonly accelerated within the electron optical column such that the electrons exhibit energy levels in the order of kiloelectron volts (keVs). In order to accurately measure electron energy spread for these electrons with keV energies down to the order of millielectron volts (meVs), the electrons within the electron optical column must first be decelerated. In this regard, embodiments of the present disclosure are directed to decelerating electrons emitted by an electron source 302 by retarding the electrons down to energy levels substantially equivalent to the initial emission energy levels of the electrons (i.e. energy levels of the electrons upon emission from the electron source 302). Following the deceleration of the electrons such that electron energy spread may be accurately determined, the electrons may be subsequently accelerated in order to be collected for energy analysis.

Figure 5:
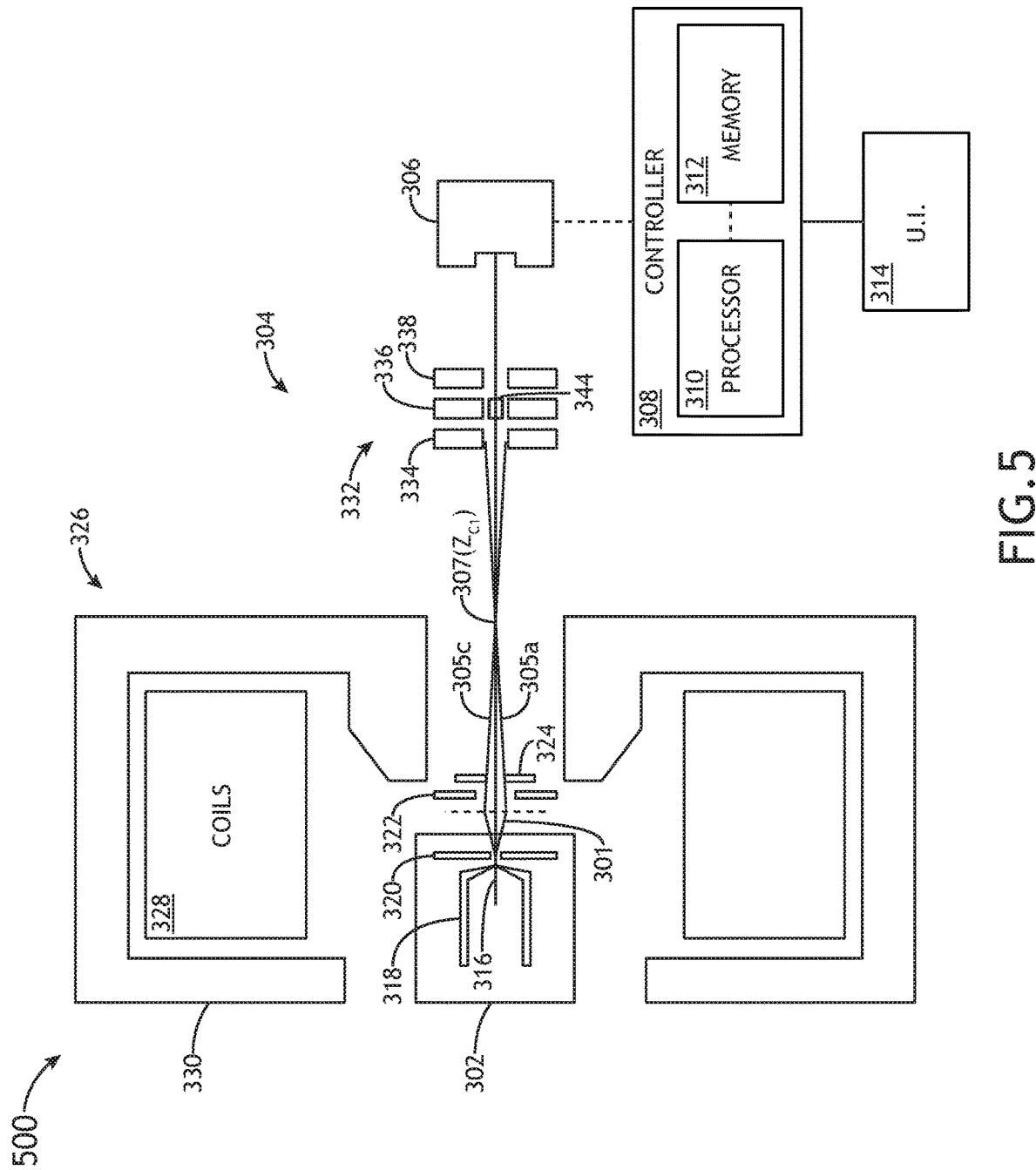
FIG. 5 illustrates a system including an electron energy analyzer, in accordance with one or more embodiments of the present disclosure.

FIG. 5 illustrates a system 500 including an electron energy analyzer 305, in accordance with one or more embodiments of the present disclosure. The system 500 may include, but is not limited to, an electron source 302, an electron analyzer 305 including one or more electron analyzer elements 304 and an electron detector 306, and a controller 308.

In one embodiment, the electron source 302 is configured to generate an electron beam 301. The electron source 302 may include any electron source known in the art including, but not limited to, a cold field emission (CFE) electron source, a thermal field emission (TFE) electron source, a carbon nanotube (CNT) electron source, a photo-cathode electron source, and the like. For example, in the case of TFE electron source, the electron source 302 may include an electron emission tip 316, a suppressor 318, and an extractor 320.

The one or more electron analyzer elements 304 of the electron analyzer 305 may include, but are not limited to, an electron-optical element 322, an aperture 324, a magnetic lens 326, and an electrostatic lens 332 (e.g., a unipotential electrostatic lens 332). In one embodiment, the electron-optical element 322 is configured to accelerate electrons of the electron beam 301. The electron-optical element 322 may include any electron-optical element known in the art configured to accelerate electrons including, but not limited to, an anode 322. In another embodiment, an aperture 324 may be configured to adjust one or more characteristics of the electron beam 301. For example, the aperture 324 may include a beam-limiting aperture configured to adjust the size and/or shape of the electron beam 301. For instance, the aperture 324 may be configured to adjust the profile of the electron beam 301 in order to maintain a proper half-beam angle α between electron rays 305 of the electron beam 301. By way of another example, the aperture 324 may be configured to select the beam current of the electron beam 301. For instance, the aperture 324 is configured to provide sufficient beam currents to enable adequate signal to noise ratios (SNR) when performing electron spread analyzing by the electron analyzer 305. Furthermore, the aperture 324 may be configured to select the beam current of the electron beam 301 in order to limit Coulomb interactions between electrons of the electron beam 301.

In another embodiment, the one or more electron analyzing elements 304 of the electron analyzer 305 includes a magnetic lens 326. The magnetic lens 326 may include any magnetic lens known in the art. For example, as shown in FIG. 5, the magnetic lens 326 may include one or more coils 328 and one or more pole pieces 330. In one embodiment, the magnetic lens 326 is configured to focus the electron beam 301 to the first electron beam crossover 307 ($Z_{c1}$). The magnetic lens 326 may be configured to focus the electron beam 301 in such a manner as to minimize the size of the first electron beam crossover 307 ($Z_{c1}$). By reducing or minimizing the size of the first electron beam crossover 307 ($Z_{c1}$), the magnetic lens 348 may improve the image resolution of an electrostatic lens 332. In another embodiment, the magnetic lens 326 is configured to optimize a half— (e.g., half-beam angle 330 α) at a second electron beam crossover ($Z_{c2}$) (not shown in FIG. 4) by adjusting magnetic excitations of the one or more coils 328 (e.g., magnetic lens 326).

Figure 4:
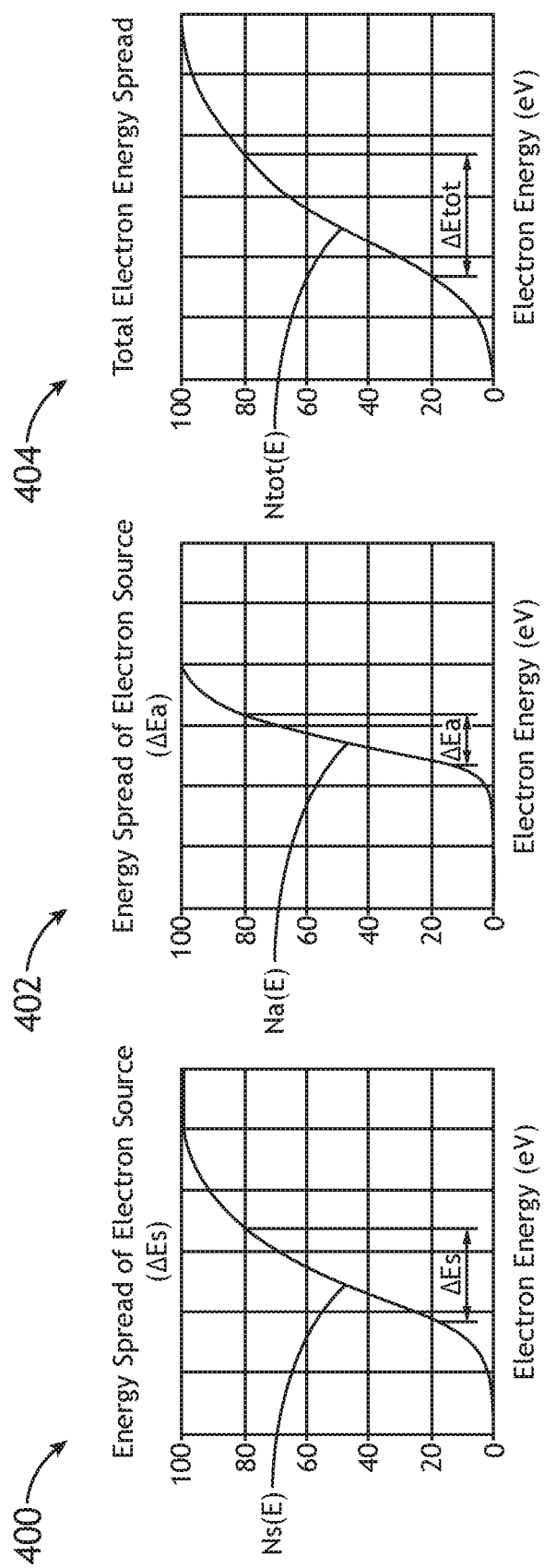
FIG. 4A illustrates a graph depicting the energy spread of an electron source, in accordance with one or more embodiments of the present disclosure.
FIG. 4B illustrates a graph depicting the energy spread of an electron analyzer, in accordance with one or more embodiments of the present disclosure.
FIG. 4C illustrates a graph depicting the total energy spread of an electron analyzer system, in accordance with one or more embodiments of the present disclosure.

In another embodiment, system 500 includes an electrostatic lens 332. In one embodiment, the electrostatic lens 332 includes a unipotential electrostatic lens 332. The unipotential electrostatic lens 332 may include any unipotential electrostatic lens known in the art including, but not limited to, an Einzel lens. In one embodiment, the unipotential electrostatic lens 332 may include, but is not limited to, a first ground electrode 334, a negative potential electrode 336, and a second ground electrode 338. The unipotential electrostatic lens 332 may be arranged such that the negative potential electrode 336 is "sandwiched" between the first ground electrode 334 and the second ground electrode 338, as shown in FIG. 4. In another embodiment, the negative potential electrode is applied with a working voltage, $V_w$.

In one embodiment, the unipotential electrostatic lens 332 is configured to generate an energy-analyzing field region 344. In another embodiment, the unipotential electrostatic lens 332 is configured to direct electrons of the electron beam 301 though the energy-analyzing field region 344 of the unipotential electrostatic lens 332 such that the electron energy spread of the electron beam 301 and/or the electron source 302 may be determined. This will be discussed in further detail herein with respect to FIGS. 6A-6C.

In another embodiment, system 500 and the energy analyzer 305 includes an electron detector 306. In one embodiment, the electron detector 306 is configured to detect/record electrons of the electron beam 301 which are passed through the energy-analyzing field region 344 of the unipotential electrostatic lens 332. In this regard, the electron detector 306 may include any electron detector and/or electron recorder known in the art. For example, the electron detector 306 may include a Faraday cup. By way of another example, the electron detector 306 may include a micro-channel plate (MCP), a PIN or p-n junction detector array, such as, but not limited to, a diode array or avalanche photo diodes (APDs) a high-speed scintillator/PMT detector, and the like. In one embodiment, as shown in FIG. 5, the electron path from the electron source 302 to the electron detector 306 is substantially linear. It is contemplated herein that the linear electron path of system 500, may provide a number of advantages over the curved electron path depicted in FIG. 1, including, but not limited to, reducing optical error sources, improved optical alignment, and the like.

In another embodiment, the electron detector 306 is configured to generate one or more signals in response to the detected electrons. The electron detector 306 may then be configured to transmit the one or more signals to a controller 308. In this regard, system 500 may include a controller 308 including one or more processors 310 and a memory 312. The controller 308 may be communicatively coupled to the electron detector 306. Furthermore, it is contemplated herein that the controller 308 may be communicatively coupled to any component or sub-system of system 500 including, but not limited to, the electron source 302, the magnetic lens 326, unipotential electrostatic lens 332, and the like.

In one embodiment, controller 308 includes one or more processors 310 and memory 312. In another embodiment, the one or more processors 310 may be configured to execute a set of program instructions stored in memory 312, wherein the set of program instructions are configured to cause the one or more processors 310 to carry out the steps of the present disclosure. For example, the one or more processors 310 may be configured to receive one or more signals from the electron detector 306, and determine an electron energy spread of the electron beam 301 and/or the electron source 302 based on the one or more signals. By way of another example, the controller 308 may be configured to generate one or more signals configured to adjust one or more components of the system 500. For example, the controller 308 may be configured to adjust one or more characteristics of the electron source 302, one or more characteristics of the magnetic lens 326, one or more characteristics of the unipotential electrostatic lens 332, and the like.

It is noted herein that the one or more components of system 500 may be communicatively coupled to the various other components of system 500 in any manner known in the art. For example, the one or more processors 310 may be communicatively coupled to each other and other components via a wireline (e.g., copper wire, fiber optic cable, and the like) or wireless connection (e.g., RF coupling, IR coupling, data network communication (e.g., WiFi, WiMax, Bluetooth and the like).

In one embodiment, the one or more processors 310 may include any one or more processing elements known in the art. In this sense, the one or more processors 310 may include any microprocessor-type device configured to execute software algorithms and/or instructions. In one embodiment, the one or more processors 310 may consist of a desktop computer, mainframe computer system, workstation, image computer, parallel processor, or other computer system (e.g., networked computer) configured to execute a program configured to operate the system 500, as described throughout the present disclosure. It should be recognized that the steps described throughout the present disclosure may be carried out by a single computer system or, alternatively, multiple computer systems. Furthermore, it should be recognized that the steps described throughout the present disclosure may be carried out on any one or more of the one or more processors 310. In general, the term "processor" may be broadly defined to encompass any device having one or more processing elements, which execute program instructions from memory 312. Moreover, different subsystems of the system 500 (e.g., electron source 302, magnetic lens 326, unipotential electrostatic lens 332, electron detector 306, controller 308, and the like) may include processor or logic elements suitable for carrying out at least a portion of the steps described throughout the present disclosure. Therefore, the above description should not be interpreted as a limitation on the present disclosure but merely an illustration.

The memory 312 may include any storage medium known in the art suitable for storing program instructions executable by the associated one or more processors 310 and the data received from the components of system 500. For example, the memory 312 may include a non-transitory memory medium. For instance, the memory 312 may include, but is not limited to, a read-only memory (ROM), a random access memory (RAM), a magnetic or optical memory device (e.g., disk), a magnetic tape, a solid state drive and the like. In another embodiment, the memory 312 is configured to store data including, but not limited to, data associated with electron spread energy received from the electron detector 306. It is further noted that memory 312 may be housed in a common controller housing with the one or more processors 310. In an alternative embodiment, the memory 312 may be located remotely with respect to the physical location of the processors 310, controller 308, and the like. In another embodiment, the memory 312 maintains program instructions for causing the one or more processors 310 to carry out the various steps described through the present disclosure.

In one embodiment, a user interface 314 is communicatively coupled to the controller 308. In one embodiment, the user interface 314 may include, but is not limited to, one or more desktops, tablets, smartphones, smart watches, or the like. In another embodiment, the user interface 314 includes a display used to display data of the system 500 to a user. The display of the user interface 314 may include any display known in the art. For example, the display may include, but is not limited to, a liquid crystal display (LCD), an organic light-emitting diode (OLED) based display, or a CRT display. Those skilled in the art should recognize that any display device capable of integration with a user interface 119 is suitable for implementation in the present disclosure. In another embodiment, a user may input selections and/or instructions responsive to data displayed to the user via the user interface 314.

Figure 6A:
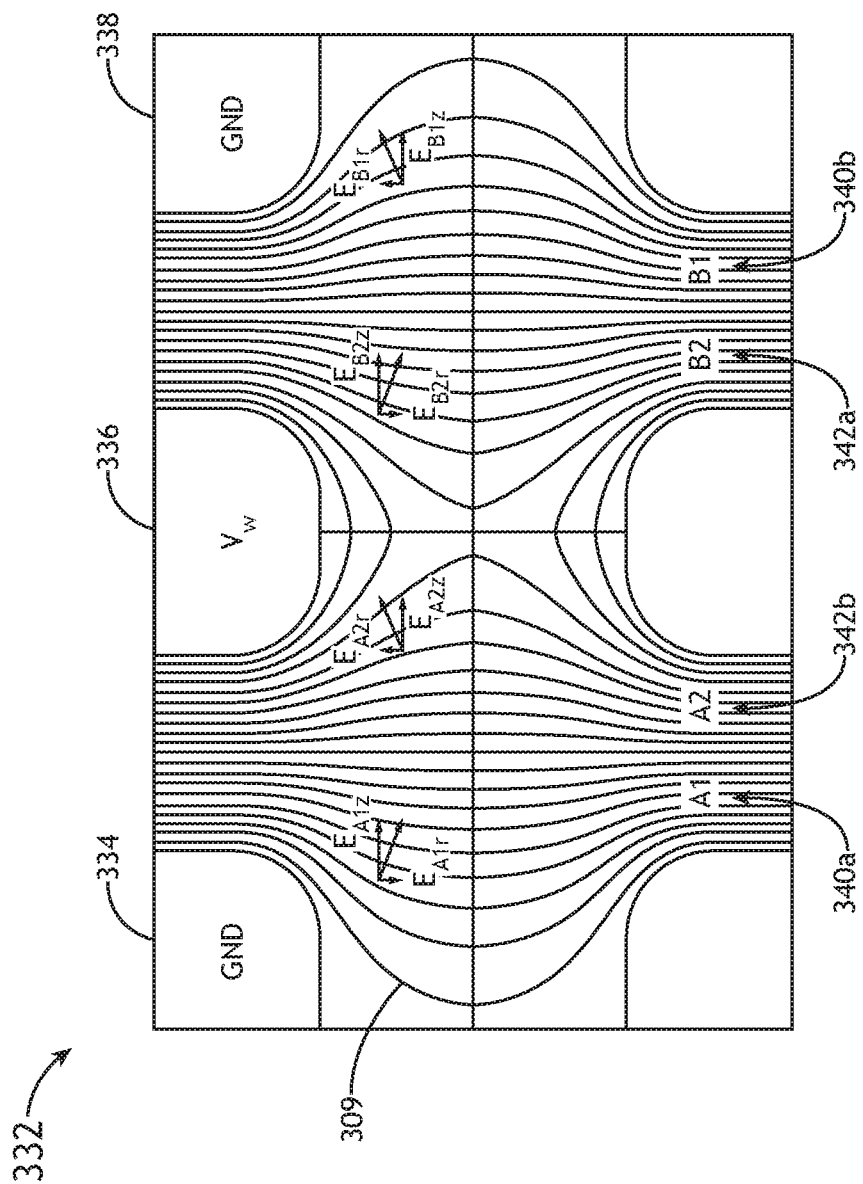
FIG. 6A illustrates equipotential lines of a unipotential electrostatic lens, in accordance with one or more embodiments of the present disclosure.

FIG. 6A illustrates equipotential lines 309 of a unipotential electrostatic lens 332, in accordance with one or more embodiments of the present disclosure.

In one embodiment, the unipotential electrostatic lens 332 may include any unipotential electrostatic lens known in the art including, but not limited to, an Einzel lens. In one embodiment, the unipotential electrostatic lens 332 may include, but is not limited to, a first ground electrode 334, a negative potential electrode 336, and a second ground electrode 338. The unipotential electrostatic lens 332 may be arranged such that the negative potential electrode 336 is "sandwiched" between the first ground electrode 334 and the second ground electrode 338, as shown in FIG. 6A. In another embodiment, the negative potential electrode is applied with a working voltage, T.

It is noted herein that unipotential electrostatic lenses (e.g., unipotential electrostatic lens 332) may be configured to decelerate and subsequently accelerate electrons. For example, the electrostatic field of the unipotential electrostatic lens 332 illustrated with equipotential lines 309 in FIG. 6A may be divided into four separate regions, labeled as A1, A2, B1 and B2. Electrical forces (e.g., $E_{A1z}$, $E_{A2z}$, $E_{B2z}$, $E_{B1z}$) generated by the applied working voltage $V_w$ may result in the characteristic deceleration regions (e.g., A1 and A2) and acceleration regions (e.g., B2 and B1) within the unipotential electrostatic lens 332. In this regard, the electrical forces within regions A1 and A2 (e.g., $E_{A1z}$, $E_{A2z}$) may act to decelerate electrons directed though the unipotential electrostatic lens 332, whereas the electrical forces within regions B1 and B2 (e.g., $E_{B1z}$, $E_{B2z}$) may act to accelerate electrons directed though the unipotential electrostatic lens 332. Accordingly, the unipotential electrostatic lens 332 may be configured to first decelerate electrons of an electron beam 301, then accelerate the electrons of the electron beam 301.

In another embodiment, electrical forces within the various regions of the unipotential electrostatic lens 332 may induce varying focus/defocus effects, such that region A1 may be referred to as defocusing region 340a, region A2 may be referred to as focusing region 342a, region B2 may be referred to as focusing region 342b, and region B1 may be referred to as defocusing region 340b. In practice, the four separate regions may be regarded as four separate lenses, as will be described in further detail herein with respect to FIG. 6B.

Figure 6B:
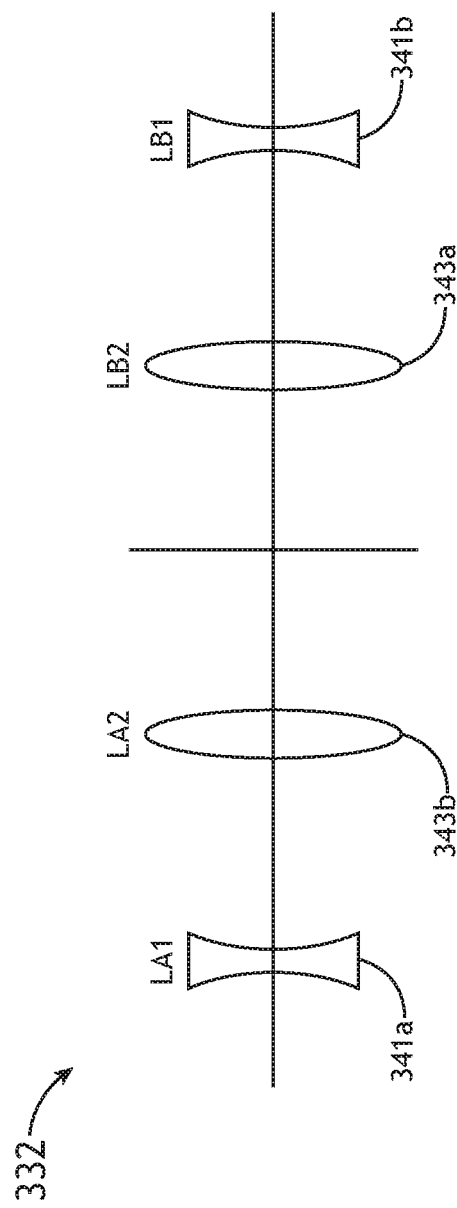
FIG. 6B illustrates equivalent electron lenses of a unipotential electrostatic lens, in accordance with one or more embodiments of the present disclosure.

FIG. 6B illustrates equivalent electron lenses of a unipotential electrostatic lens 332, in accordance with one or more embodiments of the present disclosure.

Reference will be made generally to both FIGS. 6A and 6B. In one embodiment, the four separate regions of the unipotential electrostatic lens 332 (e.g., A1, A2, B1, and B2) effectively create four equivalent electron lenses, labeled as LA1 (defocusing lens 341a), LA2 (focusing lens 343a), LB2 (focusing lens 343b), and LB1 (defocusing lens 341a). Due to the decelerating effects of the electrical forces $E_{A1z}$, $E_{A2z}$, electrons may travel faster (and exhibit higher energies) through the A1 region than through the A2 region. In this regard, the electrons may be more focused by the focusing lens 343a (LA2) than they are defocused by the defocusing lens 341a (LA1). Accordingly, the total equivalent effect within the A1-A2 region is a focusing effect, such that an equivalent lens of the LA1 and LA2 lenses is a focusing lens.

For these same reasons, accelerating effects of the electrical forces $E_{B1z}$, $E_{B2z}$ cause electrons to travel faster (and exhibit higher energies) through the B1 region than through the B2 region. In this regard, the electrons may be more focused by the focusing lens 343b (LB2) than they are defocused by the defocusing lens 341b (LB1). Accordingly, the total equivalent effect within the B2-B1 region is also focusing effect, such that an equivalent lens of the LB2 and LB1 lenses is a focusing lens.

Figure 7A:
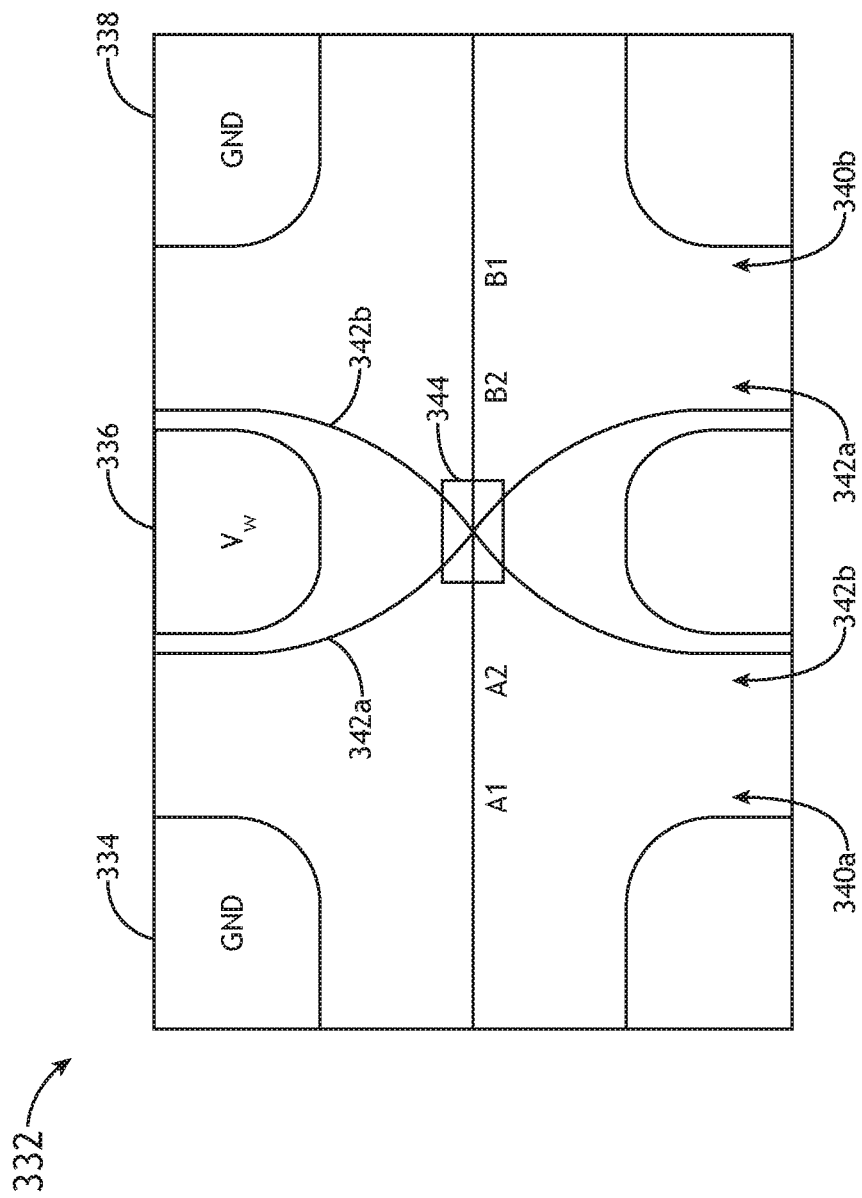
FIG. 7A illustrates fine divisions of equipotential lines and an energy-analyzing field region within a unipotential electrostatic lens, in accordance with one or more embodiments of the present disclosure.

FIG. 7A illustrates fine divisions of equipotential lines 309 and an energy-analyzing field region 344 within a unipotential electrostatic lens 332, in accordance with one or more embodiments of the present disclosure.

The equipotential lines 309 of the unipotential electrostatic lens 332 illustrated in FIG. 6A may be fine-divided with fine-division lines 342a, 342b, as shown in FIG. 7A. In another embodiment, as noted previously herein, the unipotential electrostatic lens 332 is configured to generate an energy-analyzing field region 344. For example, as shown in FIG. 7A, the energy-analyzing field region 344 may be generated proximate to the negative potential electrode 336. More particularly, the energy-analyzing field region 344 may be generated proximate to the intersection of the first fine-division line 342a and the second fine-division line 342b. As noted previously herein, the A1-A2 region acts to decelerate electrons, whereas the B2-B1 region serves to accelerate the electrons. In this regard, the electrons directed through the unipotential electrostatic lens 332 may be decelerated within region A1-A2 such that the energy of the electrons is reduced within the energy-analyzing field region 344. After passing through the energy-analyzing field region 344, the electrons may subsequently be accelerated within the B2-B1 region. Embodiments of the present disclosure are directed to analyzing electron energy spread within the energy-analyzing field region 344. It is contemplated herein that decelerating the electrons into the energy-analyzing field region 344 may allow the system and method of the present disclosure to determine energy spreads with high accuracy/resolution.

Figure 7B:
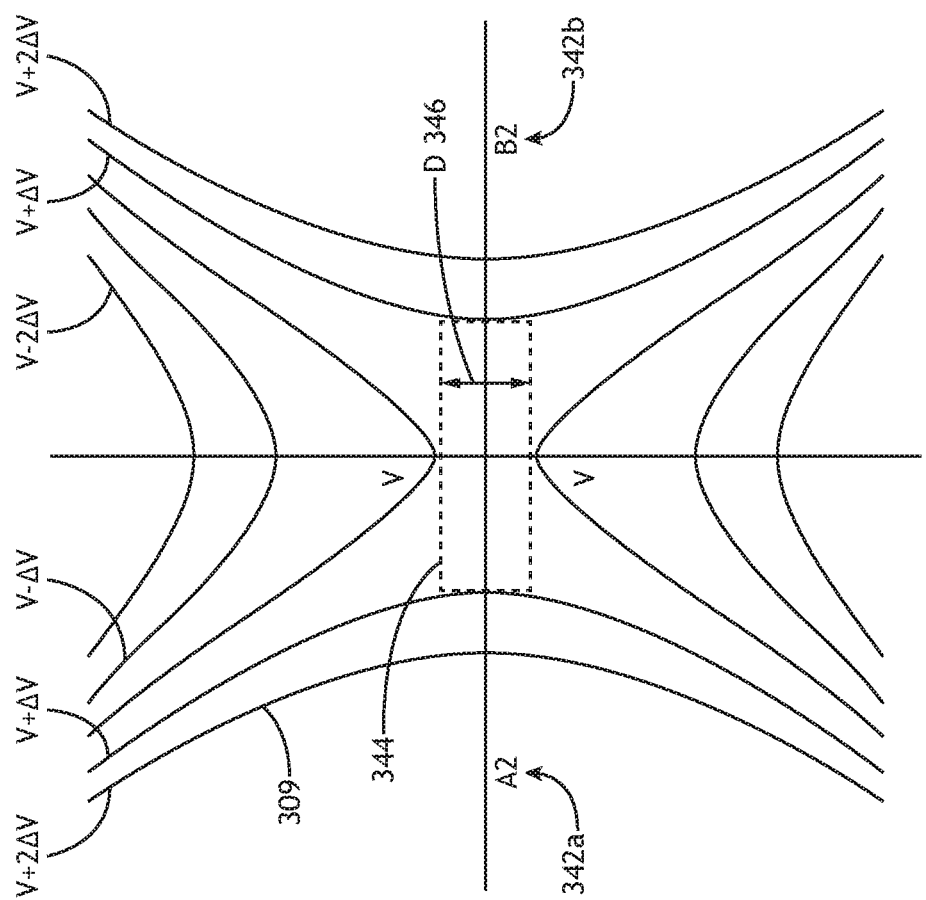
FIG. 7B illustrates an expanded view of an energy-analyzing field region within a unipotential electrostatic lens, in accordance with one or more embodiments of the present disclosure.

FIG. 7B illustrates an expanded view of an energy-analyzing field region 344 within a unipotential electrostatic lens 332, in accordance with one or more embodiments of the present disclosure.

The electrostatic field generated by the applied working voltage $V_w$ of the unipotential electrostatic lens 332 may be illustrated by a plurality of equipotential lines 309. For example, as shown in FIG. 7B, the electrostatic field may be illustrated by equipotential lines 309 denoted by V, V−ΔV, V−2ΔV, V+ΔV, and V+2ΔV, respectively. In embodiments, the potential V is a function of the working voltage $V_w$, as determined by the geometry of the unipotential electrostatic lens 332. Given a $V_w$, the equipotential line 309 V and/or the V distribution may vary with the geometry of the unipotential electrostatic lens 332, such as the bore sizes of the electrodes, distances between the electrodes, and the like. In another embodiment, the potential V is greater than the working voltage $V_w$. For example, where a negative potential electrode 336 is applied with a working voltage $V_w$=−6,200V, the potential may be V=−6,000V. It is contemplated herein that the energy spread of an electron source 302/electron beam 301 may be analyzed by the energy analyzer 305 for electrons in a beam voltage up to 6,000V.

In one embodiment, the value ΔV depicted in FIG. 7B (e.g., −ΔV, V−2ΔV, V+ΔV, and V+2ΔV) includes the energy-analyzing resolution of the energy analyzer 305. In embodiments, the energy-analyzing resolution of the energy analyzer 305 may be measured in tens of millielectron volts (meVs), such that ΔV=0.01~0.1 eV. In another embodiment, the energy-analyzing field region 344 may be defined as the region within the equipotential lines 309 denoted by V and V+ΔV. The size of the energy-analyzing field region 344 may be defined by a minimum radial direction diameter 346 (D). Through much research and computer simulations, it has been found that the diameter 346 (D) of the energy-analyzing field region 344 is approximately 1-2 microns (e.g., D=1~2 microns) for an energy-analyzing resolution of ΔV=0.02~0.03 eV. In this regard, it is contemplated herein that an energy-analyzer 305 with high resolution may be achieved if electrons of an electron beam 301 are decelerated and focused into an energy-analyzing field region 344 with a diameter 346 D=1~2 microns.

Figure 8:
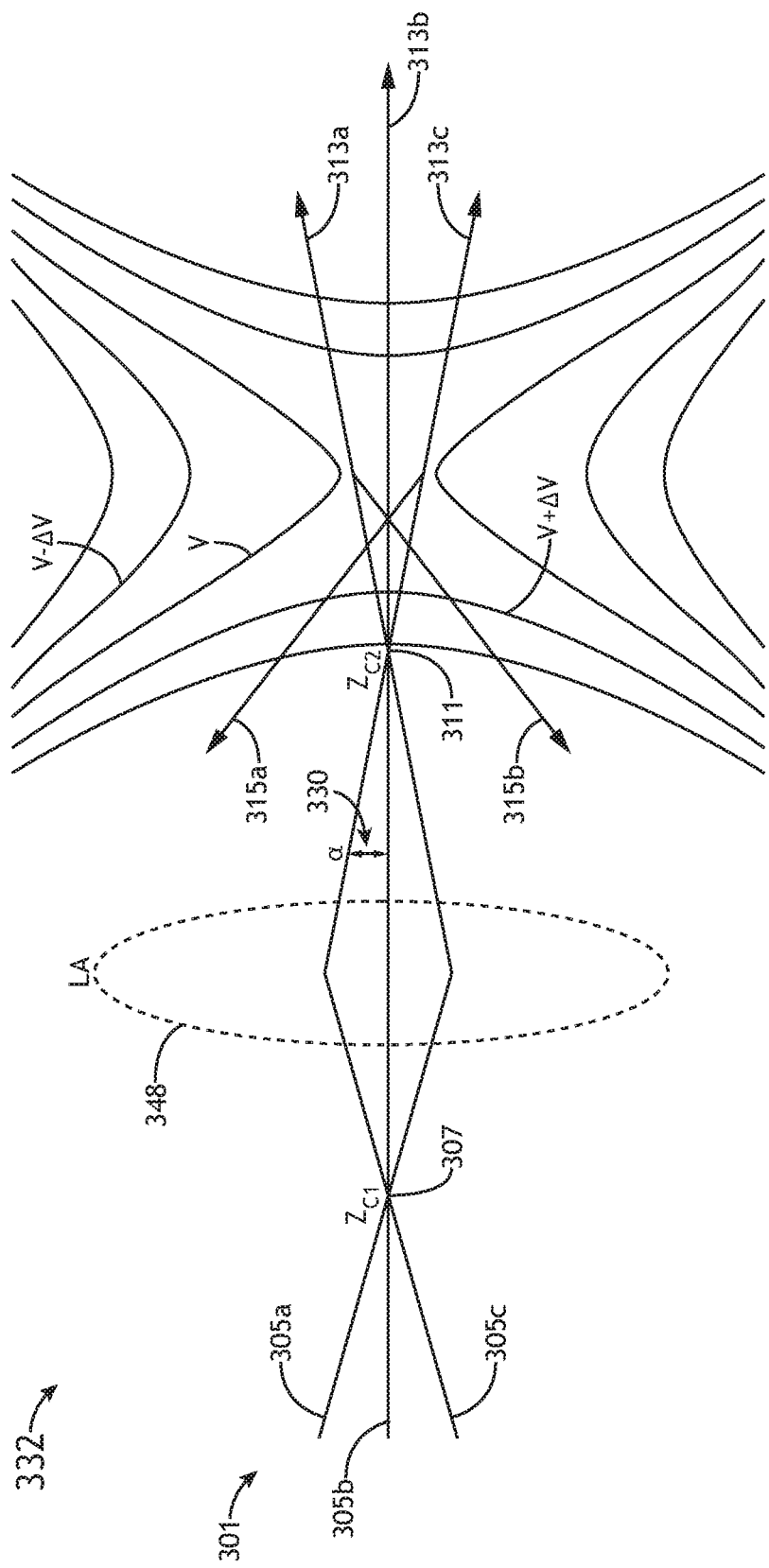
FIG. 8 illustrates a schematic view of a unipotential electrostatic lens, in accordance with one or more embodiments of the present disclosure.

FIG. 8 illustrates a schematic view of a unipotential electrostatic lens 332, in accordance with one or more embodiments of the present disclosure.

In one embodiment, an electron source 302 is configured to generate an electron beam 301 including a plurality of electron rays 305a-305c. In another embodiment, the electron source 302 is configured to direct the electron rays 305a-305c to a first electron beam crossover 307 ($Z_{c1}$). Thus, the first electron beam crossover 307 ($Z_{c1}$) may be regarded as an image plane of the electron source 302. In another embodiment, a focusing lens 326 is configured to receive and focus electron rays 305a, 305b, 305c of the electron beam 301. The focusing lens 326, denoted as focusing lens LA in FIG. 8, may include an equivalently-combined lens of lenses LA1 and LA2, as shown in FIG. 6B. In this regard, focusing lens 326 may be regarded as the focusing and decelerating/retarding regions A1 and A2, as shown in FIG. 6A.

In another embodiment, the focusing lens 326 (e.g., regions A1-A2) is configured to focus the electron rays 305a-305c to a second electron crossover 311 ($Z_{c2}$). The second electron beam crossover 311 ($Z_{c2}$) may be disposed "in front of" the equipotential line 309 V+V. For example, as shown in FIG. 8, the second electron crossover 311 ($Z_{c2}$) may be disposed between equipotential line 309 V+ΔV and the first electron crossover 311 ($Z_{c1}$). In this regard, the second electron crossover 311 ($Z_{c2}$) may be disposed between the energy-analyzing field region 344 and the first electron crossover 307 ($Z_{c1}$). A maximum half-beam angle 330 at the second electron beam crossover 311 ($Z_{c2}$) may be defined as a. Due to the fact that the electrons of the electron beam 301 are decelerated by the unipotential electrostatic lens 332 (e.g., focusing lens 326), the second electron beam crossover 311 ($Z_{c2}$) may not be formed within the energy-analyzing field region 344. By forming the second electron beam crossover 311 ($Z_{c2}$) just "in front of" the energy-analyzing field region 344, as shown in FIG. 8, the energy-analyzing resolution may be optimized.

As noted previously herein, the energy analyzer 305 of the present disclosure may be capable of an energy-analyzing resolution in the order of tens of millielectron volts (meVs). It is further noted herein that the resolution of the energy analyzer 305 may be at least partially dependent on the manipulation and characteristics of the electron beam 301, as shown in FIG. 8. For example, in some embodiments, the working voltage $V_w$ may be adjusted such that the unipotential electrostatic lens 332 is configured to decelerate/retard electrons of the electron beam 301 to energy level(s) equivalent (or substantially equivalent) to initial emission energy level(s) of the electrons (i.e. energy levels of the electrons upon emission from the electron source 302). In this regard, electrons entering the energy-analyzing field region 344 may exhibit energy levels equivalent (or substantially equivalent) to initial emission energy levels of the electron source 302. By way of another example, in some embodiments, the focusing lens 326 and/or electron source 302 may be adjusted/configured to focus the electron beam 301 such that the size (e.g., diameter, radius, and the like) of the second electron beam crossover 311 ($Z_{c2}$) is smaller than the size of the energy-analyzing field region 344 (e.g., $Z_{c2}$ size<D). In another embodiment, the size of the second electron beam crossover 311 ($Z_{c2}$) is adjusted by adjusting the size and/or position of the first electron crossover 307 ($Z_{c1}$).

By way of another example, in some embodiments, resolution of the energy analyzer 305 may be improved by focusing the electron beam 301 (e.g., plurality of electron rays 305a-305c) such that the paths of the electron rays 305a-305c are orthogonal (or substantially orthogonal) to the equipotential line 309 of V+ΔV. For example, the magnetic lens 326 may be configured to adjust magnetic excitations of the one or more coils 328 such that the paths/directions of the electron rays 305 are as close as possible to parallel to the normal direction of the equipotential line 309 of V+ΔV. By way of another example, this may be carried out by adjusting magnetic excitations of the one or more coils 328 of the magnetic lens 326 in order to adjust the size and/or position of the first electron crossover 307 ($Z_{c1}$). It has been found that electron paths of the electron rays 305a-305c which are not orthogonal to the equipotential line 309 of V+ΔV result in limited losses of electron-spread resolution of the energy analyzer 305. For example, an incidence angle of 10° between the paths of electron rays 305 and a line orthogonal to equipotential line 309 of V+ΔV (e.g., 10° off from orthogonal) may be expected to result in a 1.5% energy resolution loss. This energy resolution loss may be attributable to the electron velocity projection on the normal direction in a cosine law. In this regard, by directing the plurality of electron rays 305a-305c such that the paths of the electron rays 305a-305c are as orthogonal as possible with respect to the equipotential line 309 of V+ΔV, energy resolution loss may be reduced.

In another embodiment, following the deceleration/retardation of electrons to their initial energy levels, the unipotential electrostatic lens 332 is configured to separate electrons passing through the unipotential electrostatic lens 332 based on the initial energy levels of the respective electrons. For example, as shown in FIG. 8, electrons with initial energies greater than ΔV (e.g., electrons 313a, 313b, 313c) are passed through the energy-analyzing field region 344, and electrons with initial energies less than ΔV (e.g., electrons 315a, 315b) may be rejected from the energy-analyzing field region 344. Electrons which are passed thorough the energy-analyzing field region 344 (e.g., electrons 313a-313c) may then be detected/recorded by the electron detector 306.

Figure 9:
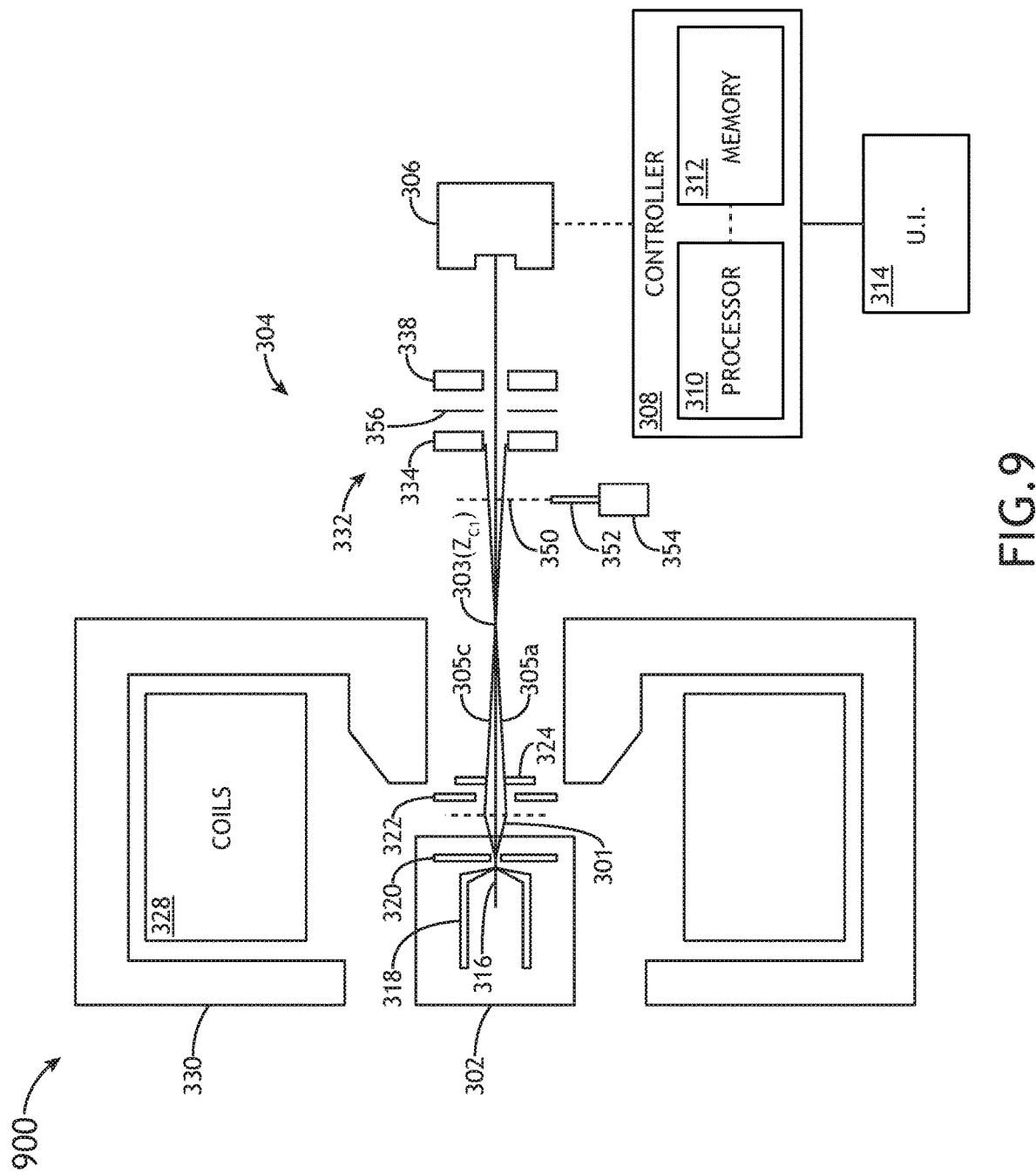
FIG. 9 illustrates a system including an electron energy analyzer, in accordance with one or more embodiments of the present disclosure.

FIG. 9 illustrates a system including an electron energy analyzer, in accordance with one or more embodiments of the present disclosure. It is noted herein that any discussion regarding the system 500 depicted in FIG. 5 may be regarded as applying to the system 900 depicted in FIG. 9, unless noted otherwise herein. Conversely, any discussion regarding the system 900 depicted in FIG. 9 may be regarded as applying to the system 500 depicted in FIG. 5, unless noted otherwise herein.

In some embodiments, system 900 may further include an aperture 350. For example, as shown in FIG. 9, an aperture 350 may be disposed along the electron beam 301 path between the first electron beam crossover 307 ($Z_{c1}$) and the energy-analyzing field region 344. In another embodiment, the size of the aperture 350 may be in the order of tens of microns. It is noted herein that the aperture 350 may be configured to select the beam current of the electron beam 301 in order to limit Coulomb interactions between electrons of the electron beam 301. Additionally, the aperture 350 may help reduce electronic noise when performing energy spread analysis with system 900. For example, if beam currents entering into the energy-analyzing field region 344 are too high, the Coulomb interactions between electrons may generate unexpected energy spreads. Conversely, if the beam currents entering into the energy-analyzing field region 344 are too low, the signal collected by the electron detector 306 may be noisy. In this regard, by selecting the beam current of the electron beam 301, the aperture 350 may further improve the accuracy and efficiency of system 900.

In another embodiment, the aperture 350 may be disposed at the end of an aperture rod 352. The aperture rod 352 may be coupled to an aperture rod driver 354 configured to actuate the aperture rod 352 and to select an optimized aperture size. In this regard, the aperture rod driver 354 may be communicatively coupled to the controller 308, wherein the controller 308 is configured to cause the aperture rod driver 354 to actuate the aperture rod 352 and aperture 350.

In another embodiment, the unipotential electrostatic lens 332 may include a sandwiched electrode including a conductive thin disc. For example, as shown in FIG. 9, the unipotential electrostatic lens 332 may include a thin disc 356 applied with the working voltage $V_w$, as described previously herein. In some embodiments, the thin disc 356 may include a bore with a bore size in the order of tens to hundreds of microns. It is contemplated herein that the unipotential electrostatic lens 332 including the thin disc 356 may be configured to generate an energy-analyzing field region 344 within/around the bore of the thin disc 356, as discussed previously herein. In this regard, any discussion regarding the unipotential electrostatic lens 332 depicted in FIGS. 5-8 may be regarded as applying to the unipotential electrostatic lens 332 depicted in FIG. 9, unless noted otherwise herein.

Figure 12:
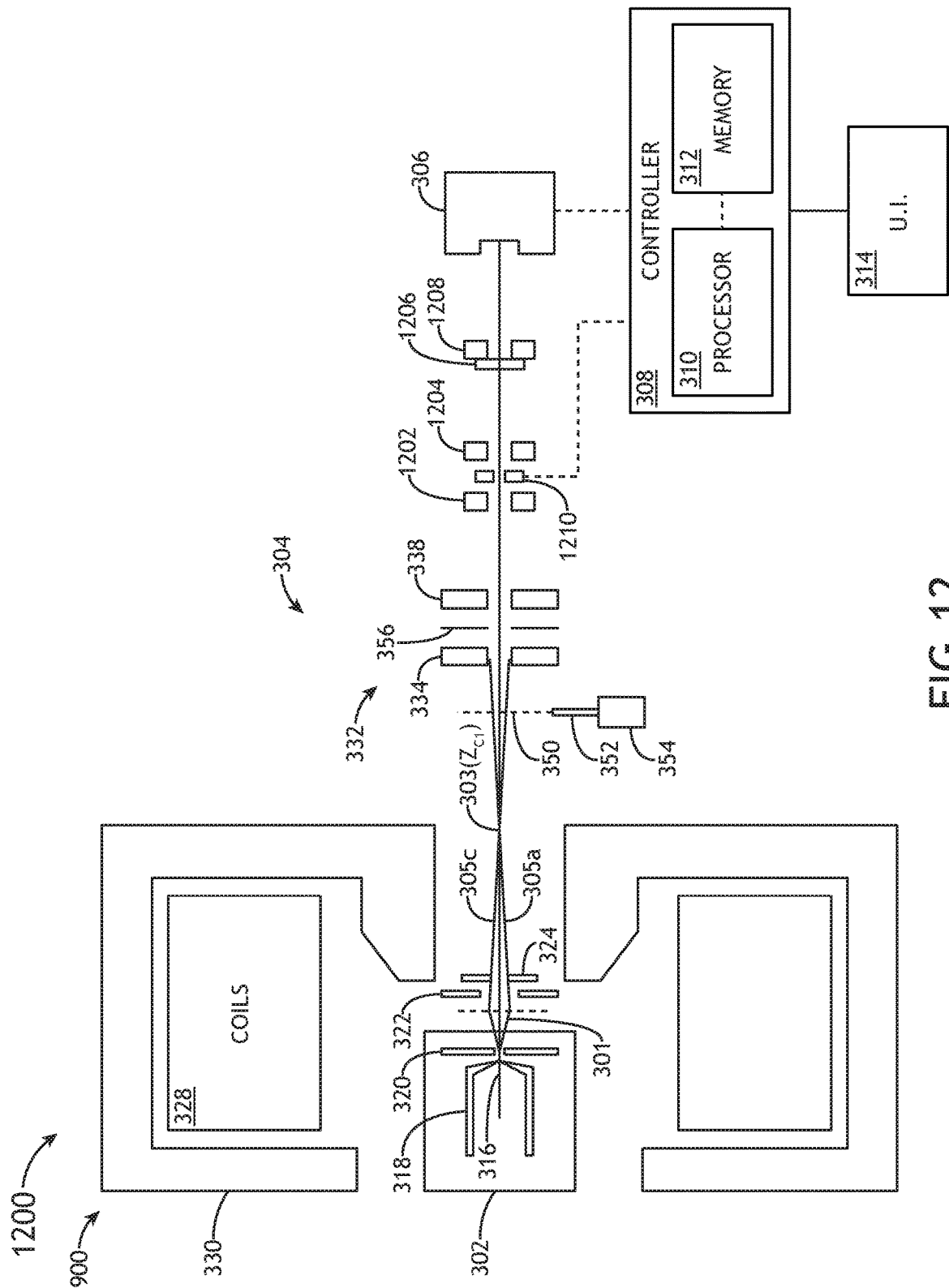
FIG. 12 illustrates a system including an electron energy analyzer disposed in an optical column of an electron beam apparatus, in accordance with one or more embodiments of the present disclosure.

FIG. 12 illustrates a system 900 including an electron energy analyzer disposed in an optical column of an electron beam apparatus 1200, in accordance with one or more embodiments of the present disclosure. It is noted herein that any discussion regarding the system 500, 900 depicted in FIGS. 5 and 9 may be regarded as applying to the system 900 depicted in FIG. 12, unless noted otherwise herein.

As noted previously herein, embodiments of the present disclosure may be implemented into an electron beam apparatus 1200. For example, as shown in FIG. 12, an electron-energy analyzer of the present disclosure (e.g., system 900) may be implemented into the optical column of an electron beam apparatus 1200. The electron beam apparatus 1200 may include any characterization system known in the art including, but not limited to, an inspection system, a review system, an image-based metrology system, and the like. In one embodiment, the electron beam apparatus 1200 may include a condenser lens 1202 and objective lens 1204 configured to direct the electron beam 301 to the surface of a sample 1206 disposed on a stage assembly. In another embodiment, the electron beam apparatus 1200 includes an electron detector 1210 configured to collect secondary electrons emitted from the surface of the sample 1206 in response to the electron beam 301. The electron detector 1210 may include any electron detector known in the art including, but not limited to, a secondary electron detector, a backscattered electron detector, a primary electron detector (e.g., an in-column electron detector shown in FIG. 12), an out-of-column detector, and the like. By way of another example, the electron detector 1210 may include a microchannel plate (MCP), a PIN or p-n junction detector array, a diode array, avalanche photo diodes (APDs), a high-speed scintillator/PMT detector, and the like. In another embodiment, the electron detector 1210 may be communicatively coupled to the controller 308. The controller 308 may then be configured to carry out various steps/functions of the electron beam apparatus 1200.

It is noted herein that including the system 900 within the optical column of the electron beam apparatus 1200 may allow system 900 to analyze the electron energy spread of the electron source 302 when the electron beam apparatus 1200 is not in use. In this regard, the system 900 may be configured to analyze the electron energy spread of the electron source 302 when a sample 1206 is not disposed on the stage assembly 1208. It is further contemplated herein that including the system 900 within the optical column of the electron beam apparatus 1200 may allow system 900 to analyze the electron energy spread of the electron source 302 and monitor the performance of the electron source 302 over time.

Figure 10:
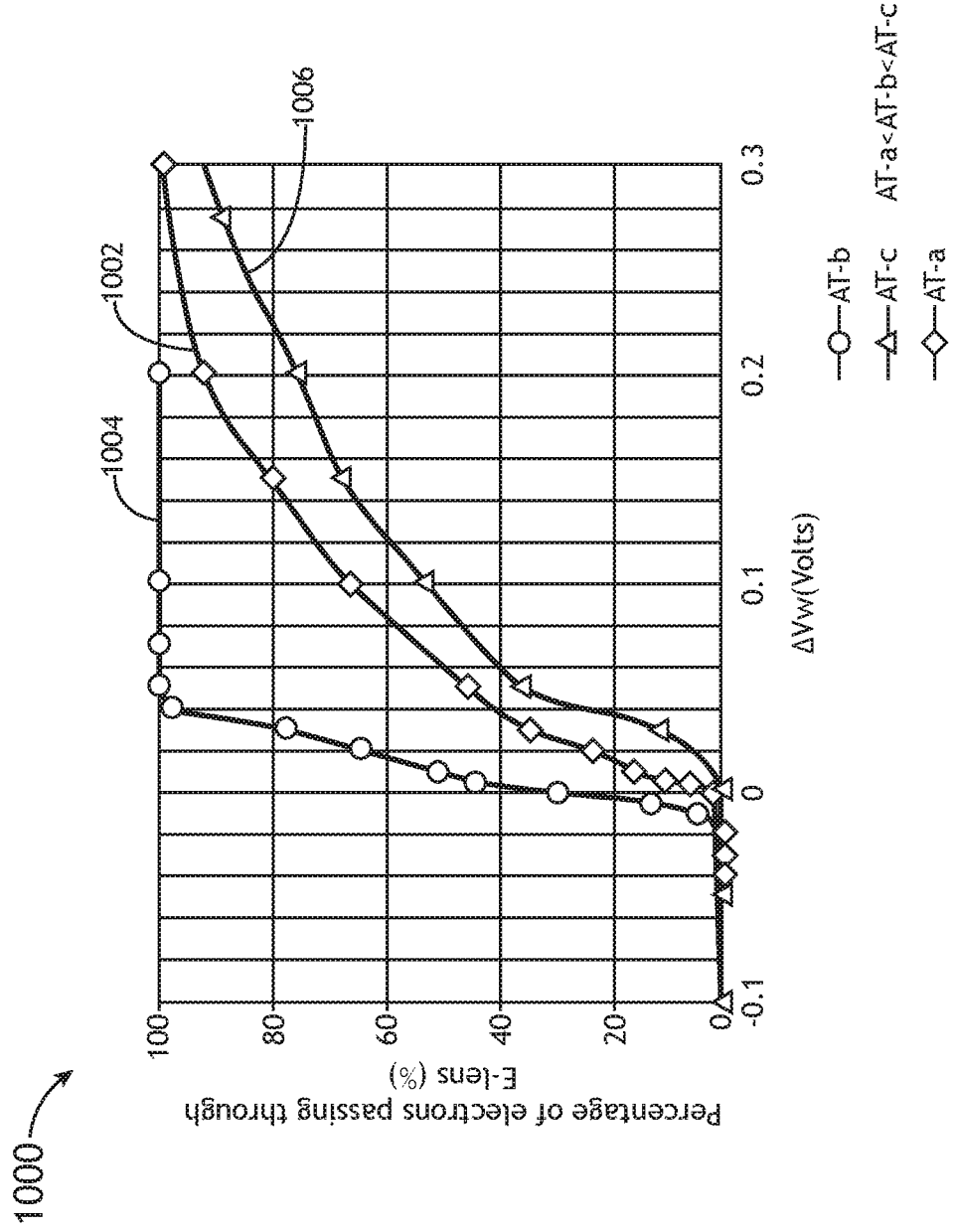
FIG. 10 illustrates a graph depicting responses of an electron energy analyzer, in accordance with one or more embodiments of the present disclosure.

FIG. 10 illustrates a graph 1000 depicting responses of an electron energy analyzer 305, in accordance with one or more embodiments of the present disclosure.

As noted previously herein with respect to FIGS. 4A-4C, the energy resolution of an electron energy analyzer 305 ($\Delta E_a$) may be defined/measured from a δ-response function of a monochromatic electron source, as shown in FIG. 4B. However, due to the fact that there are no perfect monochromatic electron sources in reality, δ-response functions of a monochromatic electron source have been modeled with Monte Carlo simulations, as shown in FIG. 10. In this regard, graph 1000 depicted in FIG. 10 illustrates δ-responses to a monochromatic electron source by Monte Carlo simulations.

Through the course of the simulations modeled in FIG. 10, monochromatic electrons were emitted from an electron source (e.g., electron source 302) by the Monte Carlo method, with initial energy levels of the electrons at 2 eV, and $\Delta E_s$=0. Following emission, the electrons were accelerated with an anode (e.g., anode 322) to a given electron beam 301 energy of 6 keV. The electron beam 301 was then focused by a given excitation of the magnetic lens 326 (e.g., 1600 AT). The electron beam 301 was then directed to the unipotential electrostatic lens 332 with an applied working voltage $V_w$=−6,200 V. Subsequently the electron trajectories from the monochromatic electron source were simulated to the electron detector 306 (e.g. Faraday cup), and the percentages of the electrons of the electron beam 301 passing through the energy-analyzing field region 344 of the unipotential electrostatic lens 332 were calculated. The working voltage $V_w$ may then be adjusted (e.g., $\Delta V_w$ illustrated on the x-axis), and the trajectories and percentages of the electrons of the electron beam 301 passing through the energy-analyzing field region 344 of the unipotential electrostatic lens 332 may be re-simulated. These data points may be plotted as a single AT-a curve 1002, indicating a constant magnetic lens 326 excitation, as shown in FIG. 10. Practically speaking, the values $\Delta V_w$ illustrated on the x-axis may be regarded as the potential differences between two equipotential lines 309, as illustrated in FIG. 6A.

After plotting the percentages of the electrons of the electron beam 301 passing through the energy-analyzing field region 344 of the unipotential electrostatic lens 332 at a first constant magnetic lens 326 excitation, the excitation of the magnetic lens 332 may be adjusted, and the simulation performed again. For example, as shown in FIG. 10, curve 1002 depicts datapoints collected at a first magnetic lens 326 excitation (AT-a), curve 1004 depicts datapoints collected at a second magnetic lens 326 excitation (AT-b), and curve 1006 depicts datapoints collected at a third magnetic lens 326 excitation (AT-c), wherein AT-a<AT-b<AT-c.

As can be seen in FIG. 10, the energy resolution of the electron analyzer 305 ($\Delta E_s$) may vary depending on the magnetic excitations of the magnetic lens 326. For example, curve 1004 (e.g., AT-b), the energy resolution of the electron energy analyzer 305 is less than 40 meV. In this regard, it is contemplated herein that the energy analyzer 305 of the present disclosure may be capable of energy resolutions in the order of tens of millielectron volts. These highly accurate energy resolutions may be required for advanced electron sources, such as CFE and CNT electron sources. It is further contemplated herein that the magnetic excitation level with the highest energy resolution (e.g., AT-b) may be selected as the "optimized" magnetic lens excitation level, and may be used to analyze energy spreads of electron sources.

Figure 11:
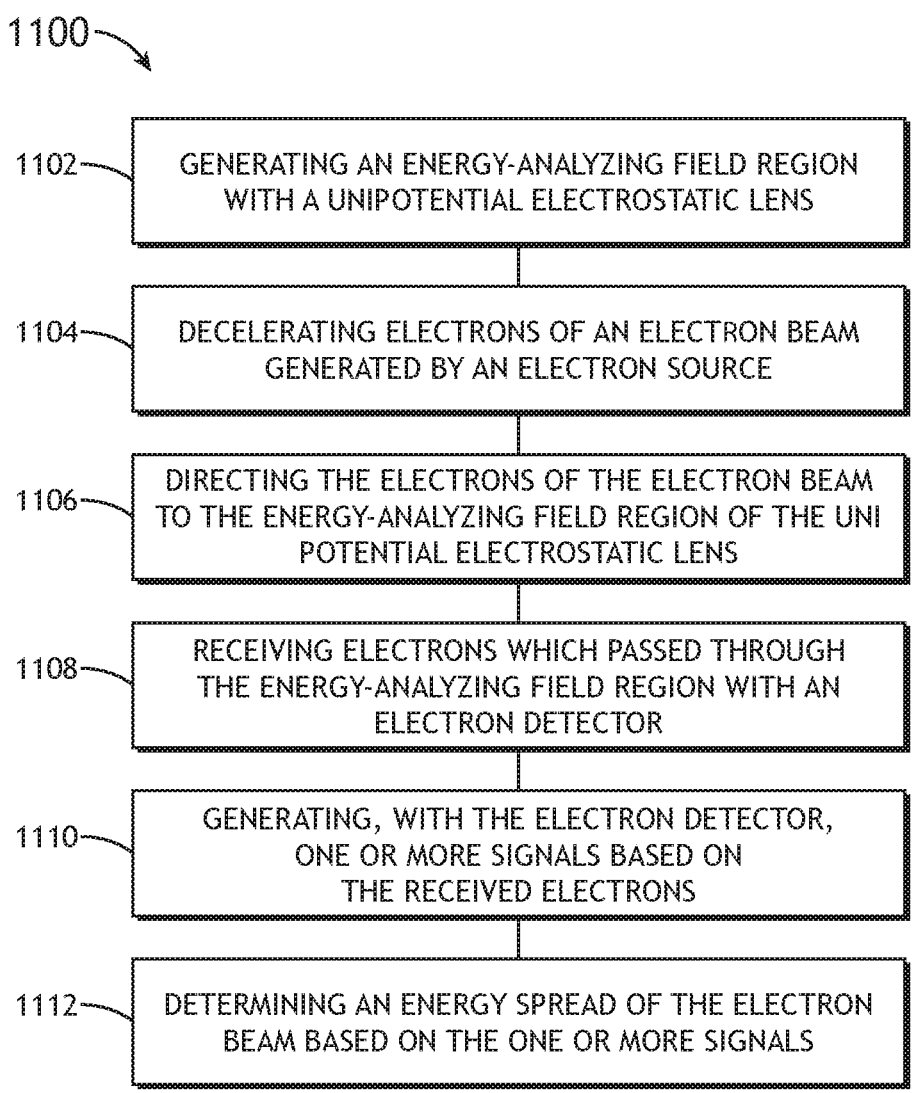
FIG. 11 illustrates a flowchart of a method for analyzing electron energies, in accordance with one or more embodiments of the present disclosure.

FIG. 11 illustrates a flowchart of a method 1100 for analyzing electron energies, in accordance with one or more embodiments of the present disclosure. It is noted herein that the steps of method 1100 may be implemented all or in part by systems 500, 900. It is further recognized, however, that the method 1100 is not limited to the systems 500, 900 in that additional or alternative system-level embodiments may carry out all or part of the steps of method 1100.

In a step 1102, an energy-analyzing field region is generated within a unipotential electrostatic lens. In one embodiment, the unipotential electrostatic lens 332 includes an Einzel lens. For example, as shown in FIG. 7B, the unipotential electrostatic lens 326 may be applied with a working voltage $V_w$ to generate an energy-analyzing field region 344. The energy-analyzing field region 344 may be sized in the order of several microns (e.g., D=1-2 microns).

In a step 1104, electrons of an electron beam generated by an electron source are decelerated. For example, as shown in FIG. 5, a magnetic lens 326 may be configured to focus an electron beam 301 generated by an electron source 302 to a first electron beam crossover 307 ($Z_{c1}$). Subsequently, a unipotential electrostatic lens 332 may be configured to decelerate/retard the electrons of the electron beam 301. For instance, as shown in FIG. 6A, regions A1 and A2 may include decelerating/retarding regions configured to decelerate electrons of the electron beam 301.

In a step 1106, the electrons of the electron beam are directed to the energy-analyzing field region of the unipotential electrostatic lens 332. For example, as shown in FIGS. 5 and 7B, the electron rays 305 of the electron beam 301 may be directed to the energy-analyzing field region 344.

In a step 1108, electrons which were passed through the energy-analyzing field region are received by an electron detector. For example, as shown in FIG. 8, electrons with initial energies greater than $\Delta V$ (e.g., electrons 313a, 313b, 313c) are passed through the energy-analyzing field region 344, and electrons with initial energies less than $\Delta V$ (e.g., electrons 315a, 315b) may be rejected from the energy-analyzing field region 344. Electrons which are passed thorough the energy-analyzing field region 344 (e.g., electrons 313a-313c) may then be detected/recorded by the electron detector 306.

In a step 1110, one or more signals are generated by the electron detector 306 based on the received electrons. For example, the electron detector 306 may be configured to generate one or more signals in response to the detected electrons. The electron detector 306 may then be configured to transmit the one or more signals to a controller 308.

In a step 1112, an energy spread of the electron beam is determined based on the one or more signals. For example, the one or more processors 310 of the controller 308 may be configured to receive the one or more signals from the electron detector 306, and calculate an energy spread of the electron beam 301 and/or electron source 302 based on the one or more received signals.

It is noted herein that the one or more components of the disclosed system may be communicatively coupled to the various other components of the system in any manner known in the art. For example, the [elements of system] may be communicatively coupled to each other and other components via a wireline (e.g., copper wire, fiber optic cable, and the like) or wireless connection (e.g., RF coupling, IR coupling, data network communication (e.g., WiFi, WiMax, Bluetooth and the like).

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken as limiting.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The previous description is presented to enable one of ordinary skill in the art to make and use the invention as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A high-resolution electron energy analyzer, comprising:
   an electrostatic lens configured to:
     generate an energy-analyzing field region;
     decelerate electrons of an electron beam generated by an electron source;
     direct the decelerated electrons of the electron beam to the energy-analyzing field region; and
   an electron detector configured to receive one or more electrons passed through the energy-analyzing field region, wherein the electron detector is further configured to generate one or more signals based on the one or more received electrons; and
   a magnetic lens configured to focus the electron beam from the electron source to a first electron beam crossover, wherein the first electron beam crossover is disposed between the electron source and the electrostatic lens, wherein the electron beam is focused to a second electron beam crossover, wherein the second electron beam crossover is disposed between the first electron beam crossover and the energy-analyzing field region.

2. The electron energy analyzer of claim 1, wherein the electrostatic lens comprises a unipotential electrostatic lens.

3. The electron energy analyzer of claim 1, further comprising a controller communicatively coupled to the electron detector, wherein the controller is configured to determine an energy spread of the electron source based on the one or more signals from the electron detector.

4. The electron energy analyzer of claim 1, wherein the size of the second electron beam crossover is smaller than the size of the energy-analyzing field region.

5. The electron energy analyzer of claim 1, further comprising an electron-optical element configured to accelerate the electrons of the electron beam toward the electrostatic lens.

6. The electron energy analyzer of claim 5, wherein the electron-optical element comprises an anode.

7. The electron energy analyzer of claim 1, wherein the energy-analyzing field region has a diameter between 0.9 and 2.1 microns.

8. The electron energy analyzer of claim 1, wherein the electrostatic lens comprises an Einzel lens.

9. The electron energy analyzer of claim 1, further comprising one or more apertures disposed between the electron source and the energy-analyzing field region, wherein the one or more apertures are configured to modify one or more characteristics of the electron beam.

10. The electron energy analyzer of claim 1, wherein the electron detector comprises a Faraday cup.

11. The electron energy analyzer of claim 1, wherein an electron path from the electron source to the electron detector comprises a substantially linear electron path.

12. The electron energy analyzer of claim 1, wherein the electrostatic lens is configured to decelerate the electrons of the electron beam generated by the electron source by retarding the electrons of the electron beam to energy levels substantially equivalent to initial emission energy levels of the electrons.

13. The electron energy analyzer of claim 1, wherein the electron energy analyzer is disposed within an optical column of an electron beam apparatus.

14. A system, comprising:
    an electron source configured to generate an electron beam;
    a magnetic lens configured to receive the electron beam;
    an electrostatic lens configured to:
      generate an energy-analyzing field region;
      decelerate electrons of the electron beam; and
      direct the decelerated electrons of the electron beam to the energy-analyzing field region; and
    an electron detector configured to receive one or more electrons passed through the energy-analyzing field region, wherein the electron detector is further configured to generate one or more signals based on the one or more received electrons, wherein the magnetic lens is configured to focus the electron beam from the electron source to a first electron beam crossover, wherein the first electron beam crossover is disposed between the electron source and the electrostatic lens, wherein the electron beam is focused to a second electron beam crossover, wherein the second electron beam crossover is disposed between the first electron beam crossover and the energy-analyzing field region.

15. The system of claim 14, wherein the electrostatic lens comprises a unipotential electrostatic lens.

16. The system of claim 14, further comprising a controller communicatively coupled to the electron detector, wherein the controller is configured to determine an energy spread of the electron source based on the one or more signals from the electron detector.

17. The system of claim 14, wherein the size of the second electron beam crossover is smaller than the size of the energy-analyzing field region.

18. The system of claim 14, further comprising an electron-optical element configured to accelerate the electrons of the electron beam toward the electrostatic lens.

19. The system of claim 18, wherein the electron-optical element comprises an anode.

20. The system of claim 14, wherein the energy-analyzing field region has a diameter between 0.9 and 2.1 microns.

21. The system of claim 14, wherein the electrostatic lens comprises an Einzel lens.

22. The system of claim 14, further comprising one or more apertures disposed between the electron source and the energy-analyzing field region, wherein the one or more apertures are configured to modify one or more characteristics of the electron beam.

23. The system of claim 14, wherein the electron detector comprises a Faraday cup.

24. The system of claim 14, wherein an electron path from the electron source to the electron detector comprises a substantially linear electron path.

25. The system of claim 14, wherein the electrostatic lens is configured to decelerate the electrons of the electron beam generated by the electron source by retarding the electrons of the electron beam to energy levels substantially equivalent to initial emission energy levels of the electrons.

26. A method of analyzing electron energies, comprising:
generating an energy-analyzing field region with a unipotential electrostatic lens;
decelerating electrons of an electron beam generated by an electron source;
directing the electrons of the electron beam to the energy-analyzing field region of the unipotential electrostatic lens;
receiving electrons which passed through the energy-analyzing field region with an electron detector;
generating, with the electron detector, one or more signals based on the received electrons; and
focusing the electron beam from the electron source to a first electron beam crossover with a magnetic lens, wherein the first electron beam crossover is disposed between the electron source and the electrostatic lens, wherein the electron beam is focused to a second electron beam crossover, wherein the second electron beam crossover is disposed between the first electron beam crossover and the energy-analyzing field region.

* * * * *